(12) United States Patent
Hetherington

(10) Patent No.: US 9,143,107 B2
(45) Date of Patent: Sep. 22, 2015

(54) SYSTEM AND METHOD FOR DYNAMICALLY MIXING AUDIO SIGNALS

(71) Applicant: QNX Software Systems Limited, Kanata (CA)

(72) Inventor: Phillip Alan Hetherington, Port Moody (CA)

(73) Assignee: 2236008 Ontario Inc., Waterloo, Ontario (CA)

( * ) Notice: Subject to any disclaimer, the term of this patent is extended or adjusted under 35 U.S.C. 154(b) by 165 days.

(21) Appl. No.: 14/048,784

(22) Filed: Oct. 8, 2013

(65) Prior Publication Data

US 2015/0098589 A1   Apr. 9, 2015

(51) Int. Cl.
*H03G 3/20*   (2006.01)
*H04R 3/00*   (2006.01)
*H04S 3/00*   (2006.01)
*G10L 21/0208*   (2013.01)

(52) U.S. Cl.
CPC .............. *H03G 3/20* (2013.01); *G10L 21/0208* (2013.01); *H04R 3/005* (2013.01); *H04S 3/00* (2013.01); *H04S 2400/15* (2013.01)

(58) Field of Classification Search
None
See application file for complete search history.

(56) References Cited

U.S. PATENT DOCUMENTS

| | | | |
|---|---|---|---|
| 4,149,032 A * | 4/1979 | Peters | 381/58 |
| 2007/0165868 A1 * | 7/2007 | Klayman et al. | 381/18 |
| 2011/0158413 A1 * | 6/2011 | Goldfarb | 381/1 |

* cited by examiner

*Primary Examiner* — Paul Huber
(74) *Attorney, Agent, or Firm* — Brinks Gilson & Lione

(57) ABSTRACT

A system and method for dynamically mixing audio signals may calculate a signal amplitude for each of two or more audio signals. The signal amplitude may be the absolute value of the audio signal. A signal sum may be calculated using each of the two or more signal amplitudes. Each of the two or more signal amplitudes may be smoothed. The signal sum may be smoothed. The smoothing may be a filter or a leaky integrator. A respective mixing gain may be calculated for each of the two or more audio signals using a respective ratio of each of the two or more smoothed signal amplitudes and the smoothed signal sum. Each of the two or more audio signals may be gain adjusted responsive to the respective mixing gain. Each of the two or more gain adjusted audio signals may be mixed to create an output signal.

20 Claims, 3 Drawing Sheets

SYSTEM AND METHOD FOR DYNAMICALLY MIXING AUDIO SIGNALS

BACKGROUND

1. Technical Field

The present disclosure relates to the field of processing audio signals. In particular, to a system and method for dynamically mixing audio signals.

2. Related Art

When mixing two or more independent audio signals together, for example, multiple parties on a conference bridge or separate microphones, there is a known issue related to dynamic range and noise. The more audio signals that are added, or mixed, together the more the noise grows while the desired audio content remains at the same level. The mixed output signal may have a reduced signal to noise ratio when compared to any one of the independent audio signals. The overall noise level may be kept lower by averaging the audio signals, but the averaging process reduces the overall gain of each audio signal.

A voice activity detector (VAD) may be applied prior to mixing where all non-voice content bearing signals may be suppressed so that the noise does not add, but this type of suppression results in an unnatural gating sound and may not be suitable for audio signals that are not voice content bearing, such as music. Each audio signal may be subject to a noise-normalization scheme, but again noise-normalization introduces gating for some sources that may be perceived as unnatural.

BRIEF DESCRIPTION OF DRAWINGS

The system may be better understood with reference to the following drawings and description. The components in the figures are not necessarily to scale, emphasis instead being placed upon illustrating the principles of the disclosure. Moreover, in the figures, like referenced numerals designate corresponding parts throughout the different views.

Other systems, methods, features and advantages will be, or will become, apparent to one with skill in the art upon examination of the following figures and detailed description. It is intended that all such additional systems, methods, features and advantages be included with this description and be protected by the following claims.

DETAILED DESCRIPTION

A system and method for dynamically mixing audio signals may calculate a signal amplitude for each of two or more audio signals. The signal amplitude may be the absolute value of the audio signal. A signal sum may be calculated using each of the two or more signal amplitudes. Each of the two or more signal amplitudes may be smoothed. The signal sum may be smoothed. The smoothing function may be a filter or a leaky integrator. A respective mixing gain may be calculated for each of the two or more audio signals using a respective ratio of each of the two or more smoothed signal amplitudes and the smoothed signal sum. Each of the two or more audio signals may be gain adjusted responsive to the respective mixing gain. Each of the two or more gain adjusted audio signals may be mixed to create an output signal.

A dynamic mixer may apply a near-instant loss to all audio signals that depends on the amplitude of each audio signal relative to the others. If all of the audio signals are the same, for example, all containing noise content, then all of the audio signals may receive equal reduction preventing an increase in the noise level. If one audio signal contains a signal of interest, or desired audio content, then the loss may be transferred to the lower amplitude audio signals where the audio signal containing the signal of interest may not lose any gain. The dynamic mixer may mix mono-channel or multichannel inputs in a similar fashion.

A dynamic mixer may be applied, for example, in a multiparty conference call where many independent audio signals are mixed together. A conference call may typically contain only one audio signal of interest, at any one time, while all of the independent audio signals are mixed together. The dynamic mixer may improve the quality of the multiparty conference call by increasing the signal to noise ratio of the output when compared to other mixing systems and methods described above.

Figure 1:
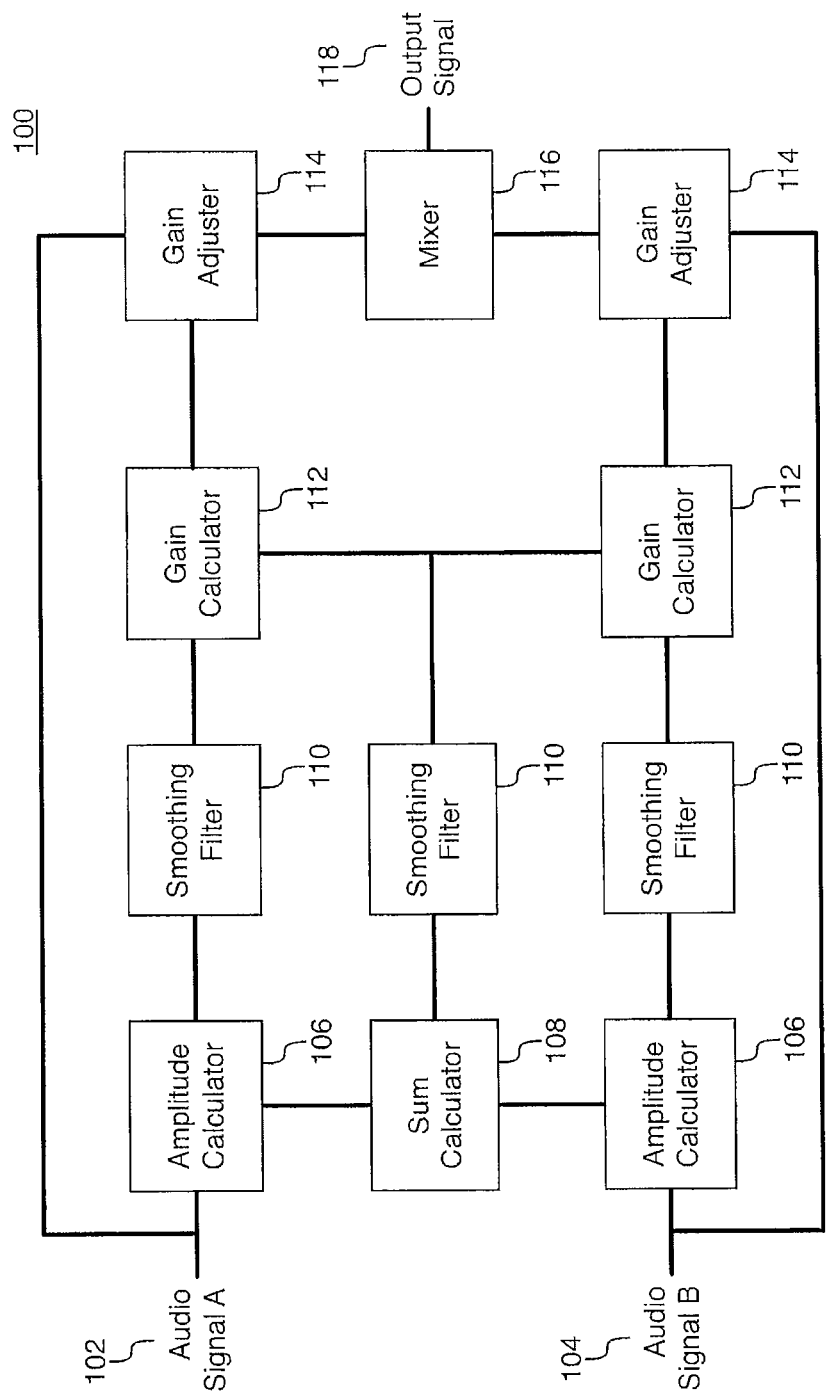
FIG. 1 is a schematic representation of a system for dynamically mixing audio signals.

FIG. 1 is a schematic representation of a system for dynamically mixing audio signals 100. Two or more amplitude calculators 106 may receive two or more respective audio signals (102 and 104). The audio signals (102 and 104) may contain content including any one or more of voice, music and noise. Each of the two or more amplitude calculators 106 may calculate a signal amplitude. The signal amplitude may be calculated as the absolute value of the audio signal (102 and 104). A sum calculator 108 may receive the signal amplitude from each of the two or more amplitude calculators 106. The sum calculator 108 may calculate a sum signal as the addition of each of the two or more signal amplitudes. A digitally sampled version of each of the two or more audio signals (102 and 104) may have a corresponding calculated signal amplitude. A single sum signal may be calculated from each of the two or more signal amplitudes. The amplitude calculators 106 and the sum calculator 108 may process a single audio sample at a time, sample by sample, or a group of samples at the time.

Smoothing filters 110 may smooth the two or more signal amplitudes and the signal sum. The smoothing filters 110 may smooth the two or more signal amplitudes and the signal sum over time. For example, the smoothing filters 110 may apply a leaky integrator where the signal amplitude and the signal sum are integrated over a short period of time. In another example, the smoothing filters 110 may average several of the previous samples together. The smoothing filters 110 may operate over a short period of time to be responsive to changes in the audio signals (102 and 104). In one example, a voice in audio signal A 102 may stop speaking and a voice in audio signal B 104 may begin speaking. Smoothing over a long time period may miss, or smooth over, the beginning of the voice in audio signal B 104. Static noise artifacts may also occur as the system may be slow to response when a long time period for the smoothing filter is used.

A gain calculator 112 may calculate the mixing gain to apply to each of the two or more audio signals (102 and 104) using a respective ratio of each of the two or more smoothed signal amplitudes and the smooth signal sum. The mixing gain calculated for any given sample of an audio signal (102 and 104) may be defined as $$\text{Mixing Gain(Audio } Signal_i) = \frac{\text{Smoothed(Amplitude(Audio } Signal_i))}{\text{Smoothed(Sum(Amplitude(Audio } Signal_j \ldots n)))}$$

where Audio Signal$_i$ may be one of the two or more audio signals (102 and 104) and Audio Signal$_j \ldots$ n may be all of the two or more audio signals (102 and 104).

A gain adjuster 114 may adjust each of the two or more audio signals (102 and 104) using the respective mixing gain. The gain adjuster 114 may multiply each of the two or more audio signals (102 and 104) by each respective mixing gain on a sample-by-sample basis. A mixer 116 may mix each of the two or more gain adjusted audio signals to create an output signal 118. The output signal 118 may be a mono-channel or a multichannel audio signal.

The result of the mixing gains applied to the two or more audio signals (102 and 104) may be illustrated when the system 100 processes audio signal A 102 and audio signal B 104. When audio signal A 102 and audio signal B 102 have the same (e.g. equal) smoothed signal amplitudes the mixing gains will result in an equal mix of the two audio signals (102 and 104). When audio signal A 102 includes voice content and the audio signal B 104 contains lower level background noise, the calculated mixing gains may apply little gain reduction to audio signal A 102 (i.e. voice) and a larger gain reduction to audio signal B 104 (i.e. noise).

An alternative mixing gain may be calculated where the mixing gain may be squared resulting in greater preservation of the loudest audio signal, but with a more noticeable ducking of the other audio signals (i.e. a soft gating effect). In another alternative mixing gain calculation, a square root may be applied to the mixing gain that may result in no discernible ducking effect, but some noticeable loss of amplitude.

A subband filter, not shown, may be applied to the audio signals (102 and 104) to extract frequency information. The subband analysis may include a time-based filter bank. The time-based filter bank may be composed of a bank of overlapping bandpass filters, where the center frequencies have non-linear spacing such as octave, $3^{rd}$ octave, Bark, mel, or other spacing techniques. A mixing gain may be calculated for each subband for each of the two of more audio signals (102 and 104). A subband dynamic mixer may allow a loud low-frequency thump from one audio signal to not produce any discernible loss in the high frequencies on another audio signal.

Figure 2:
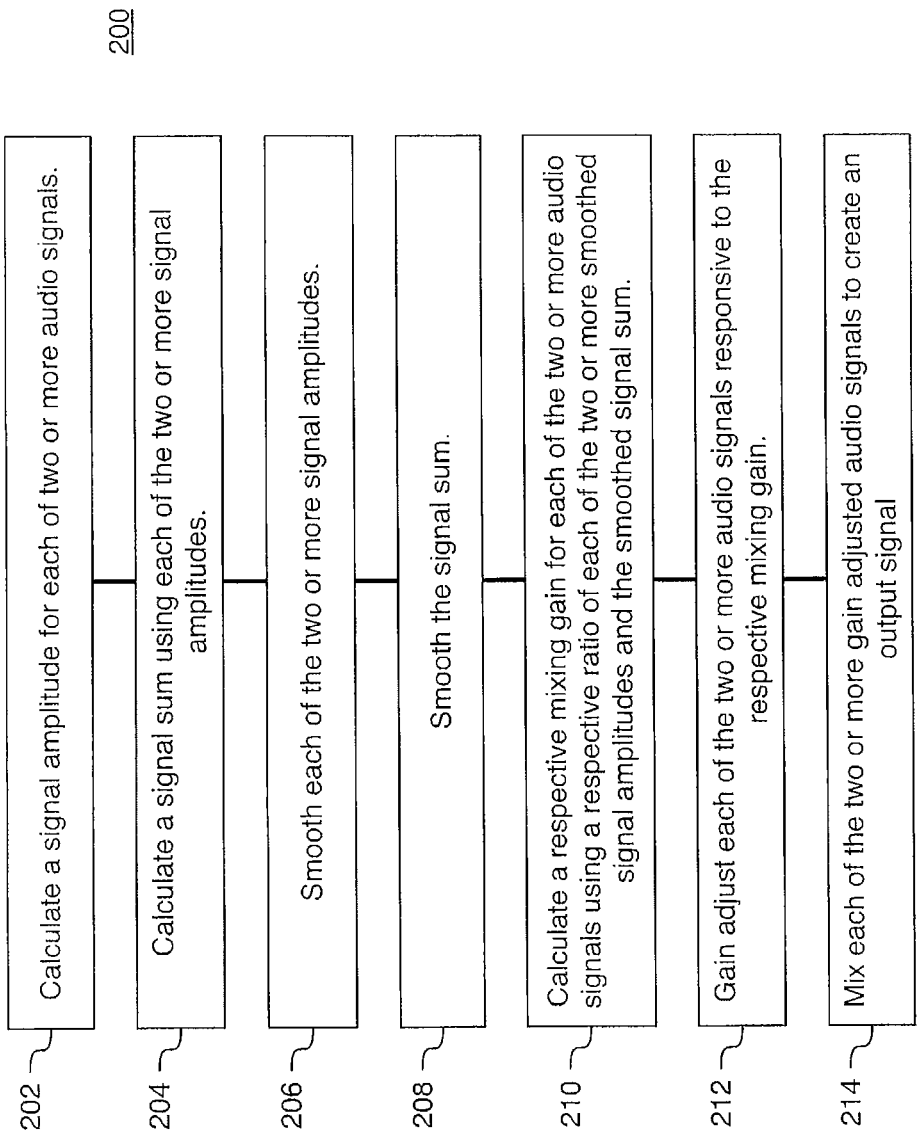
FIG. 2 is a representation of a method for dynamically mixing audio signals.

FIG. 2 is a representation of a method for dynamically mixing audio signals. The method 200 may be, for example, implemented using the systems 100 described herein with reference to FIG. 1. The method 200 includes the act of calculating a signal amplitude for each of two or more audio signals 202. A signal sum may be calculated using each of the two or more signal amplitudes 204. Each of the two or more signal amplitudes may be smoothed 206. The signal sum may be smoothed 208. A respective mixing gain may be calculated for each of the two or more audio signals using a respective ratio of each of the two or more smoothed signal amplitudes and the smoothed signal sum 210. Each of the two or more audio signals may be gain adjusted responsive to the respective mixing gain 212. Each of the two or more gain adjusted audio signals may be mixed to create an output signal 214.

Figure 3:
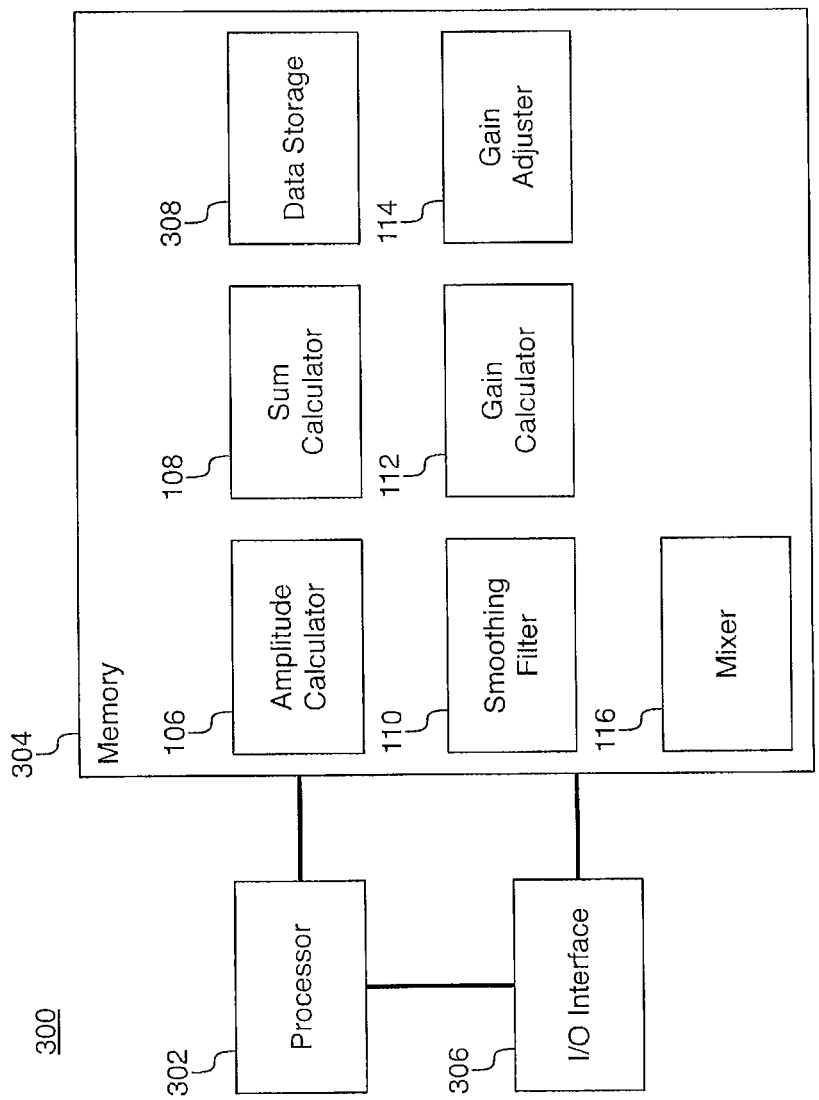
FIG. 3 is a further schematic representation of a system for dynamically mixing audio signals.

FIG. 3 is a further schematic representation of a system for dynamically mixing audio signals. The system 300 comprises a processor 302, memory 304 (the contents of which are accessible by the processor 302) and an I/O interface 306. The memory 304 may store instructions which when executed using the processor 302 may cause the system 300 to render the functionality associated with dynamically mixing audio signals as described herein. For example, the memory 304 may store instructions which when executed using the processor 302 may cause the system 300 to render the functionality associated with the amplitude calculator 106, the sum calculator 108, the smoothing filter 110, the gain calculator 112, the gain adjuster 114, and the mixer 116 as described herein. In addition, data structures, temporary variables and other information may store data in data storage 308.

The processor 302 may comprise a single processor or multiple processors that may be disposed on a single chip, on multiple devices or distributed over more that one system. The processor 302 may be hardware that executes computer executable instructions or computer code embodied in the memory 304 or in other memory to perform one or more features of the system. The processor 302 may include a general purpose processor, a central processing unit (CPU), a graphics processing unit (GPU), an application specific integrated circuit (ASIC), a digital signal processor (DSP), a field programmable gate array (FPGA), a digital circuit, an analog circuit, a microcontroller, any other type of processor, or any combination thereof.

The memory 304 may comprise a device for storing and retrieving data, processor executable instructions, or any combination thereof. The memory 304 may include non-volatile and/or volatile memory, such as a random access memory (RAM), a read-only memory (ROM), an erasable programmable read-only memory (EPROM), or a flash memory. The memory 304 may comprise a single device or multiple devices that may be disposed on one or more dedicated memory devices or on a processor or other similar device. Alternatively or in addition, the memory 304 may include an optical, magnetic (hard-drive) or any other form of data storage device.

The memory 304 may store computer code, such as the amplitude calculator 106, the sum calculator 108, the smoothing filter 110, the gain calculator 112, the gain adjuster 114, and the mixer 116 as described herein. The computer code may include instructions executable with the processor 302. The computer code may be written in any computer language, such as C, C++, assembly language, channel program code, and/or any combination of computer languages. The memory 304 may store information in data structures including, for example, mixing gains.

The I/O interface 306 may be used to connect devices such as, for example, microphone, audio transducers, and to other components of the system 300.

All of the disclosure, regardless of the particular implementation described, is exemplary in nature, rather than limiting. The system 300 may include more, fewer, or different components than illustrated in FIG. 3. Furthermore, each one of the components of system 300 may include more, fewer, or different elements than is illustrated in FIG. 3. Flags, data, databases, tables, entities, and other data structures may be separately stored and managed, may be incorporated into a single memory or database, may be distributed, or may be logically and physically organized in many different ways. The components may operate independently or be part of a same program or hardware. The components may be resident on separate hardware, such as separate removable circuit boards, or share common hardware, such as a same memory and processor for implementing instructions from the memory. Programs may be parts of a single program, separate programs, or distributed across several memories and processors.

The functions, acts or tasks illustrated in the figures or described may be executed in response to one or more sets of logic or instructions stored in or on computer readable media. The functions, acts or tasks are independent of the particular type of instructions set, storage media, processor or processing strategy and may be performed by software, hardware, integrated circuits, firmware, micro code and the like, operating alone or in combination. Likewise, processing strategies may include multiprocessing, multitasking, parallel processing, distributed processing, and/or any other type of processing. In one embodiment, the instructions are stored on a removable media device for reading by local or remote systems. In other embodiments, the logic or instructions are stored in a remote location for transfer through a computer network or over telephone lines. In yet other embodiments, the logic or instructions may be stored within a given computer such as, for example, a CPU.

While various embodiments of the system and method for on-demand user control have been described, it will be apparent to those of ordinary skill in the art that many more embodiments and implementations are possible within the scope of the present invention. Accordingly, the invention is not to be restricted except in light of the attached claims and their equivalents.

The invention claimed is:

1. A method for dynamically mixing audio signals comprising:
    calculating a signal amplitude for each of two or more audio signals;
    calculating a signal sum using each of the two or more signal amplitudes;
    smoothing each of the two or more signal amplitudes;
    smoothing the signal sum;
    calculating a respective mixing gain for each of the two or more audio signals using a respective ratio of each of the two or more smoothed signal amplitudes and the smoothed signal sum;
    gain adjusting each of the two or more audio signals responsive to the respective mixing gain; and
    mixing each of the two or more gain adjusted audio signals to create an output signal.

2. The method for dynamically mixing audio signals of claim 1, where calculating the signal amplitude comprises an absolute value calculation of each of the two or more audio signals.

3. The method for dynamically mixing audio signals of claim 1, where smoothing each of the two or more signal amplitude signal comprises temporally smoothing each of the two or more amplitude signals.

4. The method for dynamically mixing audio signals of claim 1, where smoothing the signal sum comprises temporally smoothing the signal sum.

5. The method for dynamically mixing audio signals of claim 1, where smoothing applied to each of the two or more signal amplitudes is similar to the smoothing applied to the signal sum.

6. The method for dynamically mixing audio signals of claim 1, where the mixing gains are calculated on a sample by sample basis.

7. The method for dynamically mixing audio signals of claim 1, further comprising squaring the mixing gain.

8. The method for dynamically mixing audio signals of claim 1, further comprising square rooting the mixing gain.

9. The method for dynamically mixing audio signals of claim 1, further comprising generating a set of sub-bands for each of the two or more audio signals using a subband filter; and calculating a respective mixing gain for each of the two or more audio signals further comprises calculating a respective mixing gain for each of the sub-bands.

10. The method for dynamically mixing audio signals of claim 9, further comprising generating a set of sub-bands for each of the two or more audio signals according to a critical, octave, mel, or Bark band spacing technique.

11. A system for dynamically mixing audio signals comprising:
    one or more amplitude calculators to calculate a signal amplitude for each of two or more audio signals;
    a sum calculator to calculate a signal sum using each of the two or more signal amplitudes;
    one or more smoothing filters to smooth each of the two or more signal amplitudes and to smooth the signal sum;
    one or more gain calculators to calculate a respective mixing gain for each of the two or more audio signals using a respective ratio of each of the two or more smoothed signal amplitudes and the smoothed signal sum;
    one or more gain adjusters to gain adjust each of the two or more audio signals responsive to the respective mixing gain; and
    a mixer to mix each of the two or more gain adjusted audio signals to create an output signal.

12. The system for dynamically mixing audio signals of claim 11, where calculating the signal amplitude comprises an absolute value calculation of each of the two or more audio signals.

13. The system for dynamically mixing audio signals of claim 11, where smoothing each of the two or more signal amplitude signal comprises temporally smoothing each of the two or more amplitude signals.

14. The system for dynamically mixing audio signals of claim 11, where smoothing the signal sum comprises temporally smoothing the signal sum.

15. The system for dynamically mixing audio signals of claim 11, where smoothing applied to each of the two or more signal amplitudes is similar to the smoothing applied to the signal sum.

16. The system for dynamically mixing audio signals of claim 11, where the mixing gains are calculated on a sample by sample basis.

17. The system for dynamically mixing audio signals of claim 11, further comprising a squaring function applied to the respective mixing gain.

18. The system for dynamically mixing audio signals of claim 11, further comprising a square root function applied to the respective mixing gain.

19. The system for dynamically mixing audio signals of claim 11, further comprising a sub-band filter to generate a set of sub-bands for each of the two or more audio signals using a subband filter; and where the one or more gain calculators calculates a respective mixing gain for each of the two or more audio signals for each of the sub-bands.

20. The system for dynamically mixing audio signals of claim 19, further comprising generating a set of sub-bands for each of the two or more audio signals according to a critical, octave, mel, or Bark band spacing technique.

\* \* \* \* \*